United States Patent [19]

Grah

[11] Patent Number: 4,670,335

[45] Date of Patent: Jun. 2, 1987

[54] BLANKING STRIP FOR ELECTROLYTIC PROCESSES

[75] Inventor: Klaus Grah, Solingen, Fed. Rep. of Germany

[73] Assignee: Beiersdorf Aktiengesellschaft, Hamburg, Fed. Rep. of Germany

[21] Appl. No.: 796,478

[22] Filed: Nov. 12, 1985

Related U.S. Application Data

[63] Continuation of Ser. No. 625,578, Jun. 28, 1984, abandoned, which is a continuation-in-part of Ser. No. 447,566, Dec. 7, 1982, abandoned.

[30] Foreign Application Priority Data

Dec. 12, 1981 [DE] Fed. Rep. of Germany ....... 3149282
Mar. 20, 1982 [DE] Fed. Rep. of Germany ....... 3210288

[51] Int. Cl.$^4$ ............................................. C09J 7/02
[52] U.S. Cl. ................................... 428/355; 428/346; 428/347; 524/66; 524/271; 524/55
[58] Field of Search ...................... 428/346, 355, 537.5, 428/500, 497, 347; 524/55, 59, 66, 271

[56] References Cited

U.S. PATENT DOCUMENTS

| | | | |
|---|---|---|---|
| 2,142,039 | 12/1938 | Abrams et al. | 428/355 |
| 2,374,767 | 5/1945 | Mitchell et al. | 428/355 X |
| 2,426,257 | 8/1947 | Ziegler | 428/355 |
| 2,579,481 | 12/1951 | Fenn | 428/355 X |
| 2,999,769 | 9/1961 | Korpman | 428/355 X |
| 3,005,802 | 10/1961 | Sellers | 428/355 X |
| 3,212,957 | 10/1965 | Linda et al. | 428/355 X |
| 4,068,033 | 1/1978 | Meade | 428/355 X |

Primary Examiner—Nancy Swisher
Attorney, Agent, or Firm—Sprung Horn Kramer & Woods

[57] ABSTRACT

A blanking strip, made of paper or film, for the partial blanking of objects to be electroplated, such as printed circuit boards, coated with an adhesive composition based on a plastomer, a hard resin and a plasticizer.

11 Claims, No Drawings

BLANKING STRIP FOR ELECTROLYTIC PROCESSES

This is a continuation of application Ser. No. 625,578, filed June 28, 1984 which in turn is a continuation-in-part of Ser. No. 447,566 filed Dec. 7, 1982, both now abandoned.

According to the state of the art of electroplating, predetermined surfaces of objects to be electroplated, for example printed circuit boards, are kept free of precipitates by being covered with self-adhesive blanking strips. These strips consist of a paper carrier or film carrier, which is equipped with an elastic self-adhesive composition.

Owing to a certain rigidity of the carrier and only slight deformability of the composition, there are obstacles to satisfactory blanking when the distance between two elevations (for example conductor tracks) is only relatively small and/or the elevations are relatively high. The cavities that are formed in this case can take up liquids, which adversely affect the object to be electroplated.

A further disadvantage is that, when elevated surfaces and the standard level are glued together in this way, the adhesive bond is under stress (elastic deformation). This restoring capacity causes, especially when the adhesive joint is subjected to elevated temperatures, for example elevated bath temperatures, a decrease in the adhesion of the contact adhesive and, as a result, partial detaching of the blanking cover.

The effect results, as above, in inward migration of bath liquid with its adverse consequences.

A further disadvantage of a self-adhesive strip is that possibilities for correction are restricted.

It is the object of the invention to provide a blanking strip that ensures complete blanking of the part to be blanked off of an object to be electroplated, and to do so regardless of the height of the elevations and/or the mutual distances of the elevations, and in which, furthermore, no major stresses appear during the gluing process and, moreover, no detaching occurs under the influence of elevated temperatures.

Surprisingly, the problem can be solved with the aid of a paper blanking strip or film blanking strip, coated with an adhesive composition based on a plastomer, a hard resin and a plasticizer.

The composition is not self-adhesive at room temperature. The strip can therefore be easily shifted for correction. Gluing is effected by heat-activation at about 100°–140° C. The resin melts within this temperature range approximately and the plastomer softens. The adhesive composition can thus adapt itself without stress to the elevations or depressions of the substrate, without cavities. In the process, the plasticizer content ensures that the system remains free from stress and without restoring forces even at 20°–65°.

The necessary prerequisites for the selection of the base products is that they are reactive, do not have any corrosive action on printed circuit boards, are not soluble in water, do not interact with the electroplating strips, can be removed with solvents after the heat activation and the electroplating process and that any residues have no influence on the soldering operation.

The plastomers are responsible for the internal strength of the adhesive layer. For example, solvent-soluble cellulose derivatives, such as ethyl-cellulose or cellulose acetobutyrate, or vinyl polymers, such as polyvinyl acetate, vinyl polymers, such as polyvinyl acetate, copolymers of ethylene and vinyl acetate, poly acrylate and poly methacrylate, can be employed.

The function of the hard resin is to melt within the sealing range, to form a compatible solution with the plastomer and to wet the parts to be glued (that is to say, to creep into all the cavities and capillaries under surface tension and to yield adequate adhesion on cooling). Relatively high bonding strengths, such as are otherwise customary or aimed at for adhesives, are not required in this case. Synthetic hard resins, such as maleate resins (glycerol ester or pentaerythritol ester of maleic acid), benzoate resins and terpene resins, or natural resins, such as rosin and its derivatives, having a softening range of about 60°–110° C., can be employed.

The plasticizer serves for rendering the possibly brittle elastomer/resin composition flexible, improves the flow behavior within the sealing range and, by minimising stress peaks, prevents partial detaching of the blanking layer.

Suitable plasticizers are phthalates and adipates, and also soft resins, such as hydrogenated methyl resinates, and liquid urea resins (modified urea formaldehyde resins as plasticiser and softener).

Preferably, the composition comprises about 10–60% by weight of plastomer and 70–30% by weight of hard resin, the balance being plasticizer and the plasticizer content being advantageously about 30–5% by weight, especially 20–10% by weight.

EXAMPLE 1

Blanking strip, PVC carrier, 50 μm, coated with 100 g/m² of a composition consisting of 50% by weight of ethyl-cellulose, 30% by weight of maleate resin and 20% by weight of liquid urea resin. The coated is applied from solution and dried.

The blanking strip is sealed onto a printed circuit board at 100° C. and, as a check, introduced into an etching bath at 60° C. The PVC film is then stripped off and the adhesive composition washed off with solvent. No migration underneath.

EXAMPLE 2

Blanking strip, 100 μm paper carrier, coated with 100 g/m² of a composition consisting of 40% by weight of polyvinyl acetate, 40% by weight of rosin and 20% by weight of polymeric phthalic esters. On checking, the same result is obtained as in Example 1. Owing to its ready penetrability by solvents, the paper carrier need not be stripped off first.

What is claimed is:

1. A non-self adhesive, heat-activatable electroplating blanking strip for partial blanking of objects to be electroplated, comprising:
    (a) a carrier substrate selected from the group consisting of paper and film, and
    (b) an adhesive composition coated on said substrates, said composition comprising:
        (i) 10 to 60% by weight of plastomer component selected from the group consisting of a solvent-soluble cellulose derivative, polyvinyl acetate, copolymers of ethylene and vinyl acetate, polyacrylates and polymethacrylates, said component having softening temperatures ranging from 100° to 140° C.,
        (ii) 70 to 30% by weight of a hard resin component selected from the group consisting of maleate, benzoate, terpene and natural resins such as rosin, (iii) 60 to 10% of a plasticizer component selected from the group consisting of phthalate, adipate, methyl resinates and liquid urea resins.

2. The blanking strip as claimed in claim 1, comprising a carrier made of PVC film, coated with a composition containing 50% by weight of ethyl-cellulose, 30% by weight of maleate resin and 20% by weight of liquid urea resin.

3. The blanking strip as claimed in claim 1, comprising a paper carrier, coated with a composition containing 40% by weight of polyvinyl acetate, 40% by weight of rosin and 20% by weight of polymeric phthalic ester.

4. A blanking strip according to claim 1, wherein the content of plasticizer is 30 to 5% by weight.

5. A blanking strip according to claim 1, wherin the content of plasticizer is 10 to 20% by weight.

6. A blank strip according to claim 1, wherein said cellulose derivative is selected from the group consisting of ethyl cellulose and cellulose acetobutyrate.

7. A blanking strip according to claim 1, wherein said plastomer is polyvinyl acetate.

8. A blanking strip according to claim 1, wherein the resin is rosin.

9. A blanking strip according to claim 8, wherein the plasticizer is hydrogenated methyl resinate.

10. A blanking strip according to claim 1, wherein said hard resin is a maleate resin selected from the group consisting of glycerol ester, and pentaerythritol ester of maleic acid.

11. A blanking strip according to claim 1, wherein said liquid urea resin is a modified urea formaldehyde resin.

* * * * *